United States Patent [19]

Kennett

[11] Patent Number: 4,644,293
[45] Date of Patent: Feb. 17, 1987

[54] RF PULSE MODULATED AMPLIFIER HAVING CONDUCTION ANGLE CONTROL

[75] Inventor: Scott W. Kennett, West Jordan, Utah

[73] Assignee: E-Systems, Inc., Dallas, Tex.

[21] Appl. No.: 795,485

[22] Filed: Nov. 6, 1985

[51] Int. Cl.[4] .......................... H03F 3/19; G01S 9/56
[52] U.S. Cl. .................................... 330/296; 330/130; 330/298; 332/9 T; 375/71; 375/73
[58] Field of Search .................. 330/136, 185, 207 P, 330/296, 298, 129, 130; 455/98, 117, 127; 343/5 LS, 6.5 R, 7.3; 375/60, 68, 71, 73; 332/9 T

[56] References Cited

U.S. PATENT DOCUMENTS

| | | | |
|---|---|---|---|
| 3,667,049 | 5/1972 | Ostroff et al. | 332/9 T X |
| 4,107,630 | 8/1978 | Schucht | 332/9 T |
| 4,117,411 | 9/1978 | Goble | 330/10 |
| 4,302,792 | 11/1981 | Harwood | 330/207 P X |
| 4,322,689 | 3/1982 | Schucht | 330/285 |
| 4,379,996 | 4/1983 | Weber | 330/296 |
| 4,417,358 | 2/1983 | Zeis | 455/127 X |

*Primary Examiner*—James B. Mullins
*Attorney, Agent, or Firm*—Albert M. Crowder, Jr.

[57] ABSTRACT

A pulse modulated amplifier is described comprising a power transistor having a grounded base, an emitter for receiving a drive signal to be amplified, and a collector for emitting a high frequency pulse, the power transistor operating over a substantially 360° conduction angle variation during which the drive signal is amplified. The pulse modulated amplifier preferably includes a pulse modulator for generating a modulation drive voltage, and a current driver circuit responsive to the modulation drive voltage for generating a control current. The control current is applied to the emitter of the power transistor to control the output power of the emitted high frequency pulse. For a given drive signal the conduction angle of the power transistor is proportional to the control current, and for a given control current the conduction angle of the power transistor is inversely proportional to the drive signal. Accordingly, the instantaneous conduction angle of the power transistor varies throughout the generation of the high frequency pulse such that the pulse amplifier transitions from Class A through Class AB to Class C operation.

14 Claims, 1 Drawing Figure

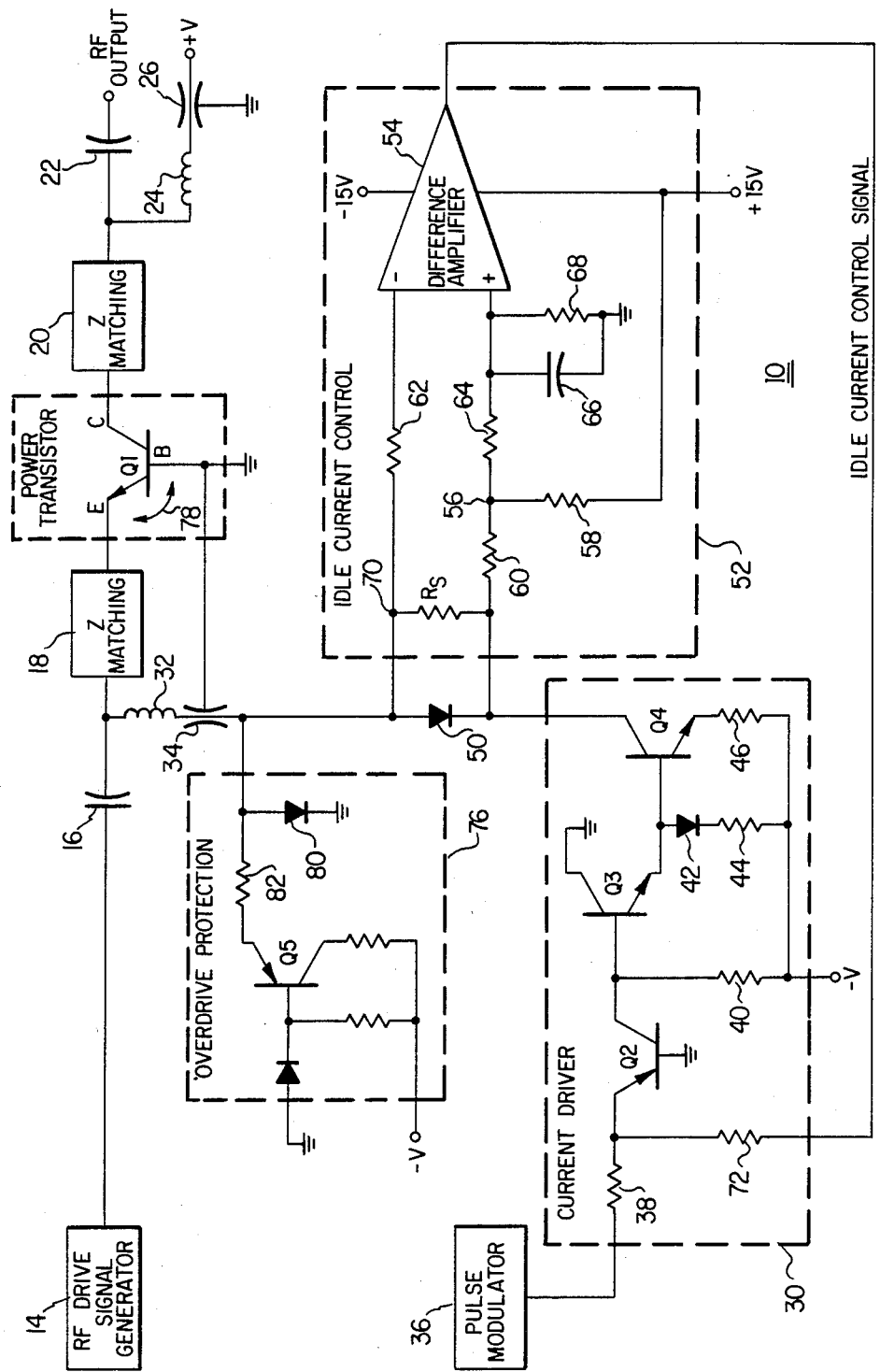

Current flow in the power transistor Q1 is controlled by a current driver circuit designated generally by the reference numeral 30. As will be described in more detail below, current driver circuit 30 generates a control current which is applied to the emitter of the power transistor Q1 through an RF decoupling circuit comprising high frequency choke 32 and feed-through capacitor 34.

As is known in the art, the DME/P requires a carefully shaped pulse to help conserve the rather limited frequency spectrum allocated for an individual channel of the microwave landing system (MLS). Conservation is typically achieved through use of RF reply pulses having a "cos/cos$_2$" envelope, meaning that the leading pulse edge is shaped as the function "cos" and the trailing pulse edge is shaped as the function "cos$^2$." The RF pulse generated by the pulse modulated amplifier 10 has a rise time (10%–90% of the leading edge of the pulse) on the order of 1 microsecond, and a linear partial rise time (5%–30% of the leading edge) on the order of 250 nanoseconds.

Referring back to the FIGURE, the preferred RF reply pulse envelope is generated by a pulse modulator 36, which generates a modulation drive volatge (defining this envelope) at its output. Although the present invention is directed to use of the pulse modulated amplifier 10 in the context of a DME/P transmitter, the amplifier 10 may be used for a variety of other types of pulse generation applications. Accordingly, pulse modulator 36 may be adapted to generate pulses of varying envelopes, including sine-wave, square-wave, Gaussian and the like.

The modulation drive voltage output from the pulse modulator 36 is applied through a resistor 38 to the emitter of a first transistor Q2 of the current driver circuit 30. Transistor Q2 of the current driver circuit 30 is operated in a grounded base configuration to allow the emitter and collector thereof to be referenced to different voltages. The resistor 38 is preferably on the order of 1000 ohms, and it therefore acts essentially as a current source substantially dependent on the modulation drive voltage supplied by the pulse modulator 36. Because the transistor Q2 is in a grounded base configuration, the voltage drop across its emitter-base junction is approximately fixed at one diode drop, or 0.7 volts. The collector of transistor Q2, however, is tied to a negative supply voltage through resistor 40.

The signal voltage output from the transistor Q2 is supplied as base drive for a second transistor Q3 of the current driver circuit 30. Transistor Q3, which has a grounded collector and an emitter circuit comprising diode 42 and resistor 44 connected to the negative supply voltage, acts as a buffer with a high input impedance and a low output impedance. Transistor Q3 operates to drive a primary drive transistor Q4 of the current driver circuit 30. A resistor 46 is connected between the emitter of transistor Q4 and the negative supply voltage. Transistor Q4 generates a control current at its collector proportional to the modulation drive voltage.

The control current supplied from transistor Q4 of the current driver circuit 30 is supplied through a diode 50, through the RF decoupling circuit comprising choke 32 and feed-through capacitor 34, and then to the emitter of the power transistor Q1. This current operates to control the output power of the high frequency pulses emitted on the collector of the power transistor Q1.

According to a feature of the present invention, the power transistor Q1 is operated as a modulated amplifier by controlling this transistor's gain compression. This is achieved by varying the transistor's conduction angle throughout the generation of each RF pulse. As is well-known, "conduction angle" refers to that portion of an input sine-wave cycle during which load current flows in a transistor. The instantaneous conduction angle of power transistor Q1 is a function of the RF drive signal supplied by the RF drive signal generator 14, and a function of the control current supplied by the current driver circuit 30. For a given drive signal applied by the drive signal generator 14, the conduction angle of the power transistor Q1 is proportional to the control current. Conversely, for a given control current supplied by the current driver circuit 30, the conduction angle of the power transistor Q1 is inversely proportional to the drive signal. Accordingly, the conduction angle of the power transistor Q1 continually self-adjusts throughout the generation of each RF pulse depending on the instantaneous drive conditions provided by the RF drive signal generator 14 and the control current from the current driver circuit 30. This operation causes the conduction angle of the power transistor Q1 to vary throughout the duration of the high frequency pulse over a range of 0° to substantially 360°, corresponding to transitions from Class A through Class AB to Class C operation.

Due to the limited amount of control current allowed to flow by the current driver circuit 30, power transistor Q1 operates in a Class AB or Class C current cutoff compression mode over most of the RF pulse cycle. The amount of gain compression exhibited by power transistor Q1 in this high-level signal condition is controlled by the current driver circuit, which is in turn controlled by the pulse modulator 36. For a given instantaneous Q1 control current (while the amplifier is in this high-level Class AB or Class C current cutoff compression mode), greater RF drive supplied by the RF drive signal generator 14 does not significantly increase the RF output power at the output of the pulse amplifier 10 because the RF output power (in this overdrive compression state) is limited by the control current.

The present invention advantageously provides an RF pulse modulated amplifier, for use preferably in a DME/P transmitter, which exhibits improved performance over prior art amplifiers of this type. This improvement is attained by controlling the instantaneous conduction angle of the RF power transistor Q1 as a function of both the RF drive power as well as the control current supplied by the current driver circuit 30.

The class of operation of the power transistor Q1 transitions gradually from Class A through Class AB to Class C (and vice versa) during the period of the RF pulse generation. According to another feature of the invention, the current in the emitter of power transistor Q1 between generation of the RF pulses, or "idle current," is measured by means of an idle current sensing resistor $R_s$. An idle current control circuit 52 is also provided to force the idle current through predetermined value between generation of the high frequency pulses by the pulse amplifier. This current ensures that power transistor Q1, as well as the transistors Q2–Q4 of the current drive circuit 30, remain "ON" between generation of the RF pulses.

The idle current control circuit 52 includes the idle current sensing resistor $R_s$ connected across the invert-

RF PULSE MODULATED AMPLIFIER HAVING CONDUCTION ANGLE CONTROL

TECHNICAL FIELD

The present invention relates to pulse generation techniques and more particularly to an RF pulse modulated amplifier incorporating a power transistor having an instantaneously-variable conduction angle.

BACKGROUND OF THE INVENTION

Microwave landing systems (MLS) facilitate aircraft approach and landing operations. These systems include so-called precision distance measuring equipment (DME/P) which provides aircraft distance information by measuring total round-trip time between pulse interrogations from an airborne transmitter and replies from a ground transponder. This type of system provides high accuracy ranging information in the severe multipath environment encountered during landing operations. In operation, the ground transponder in the DME/P generates a time delay upon receipt of an interrogation pulse. After a fixed time, a reply pulse is transmitted by the transponder through use of an RF transmitter.

To provide accurate aircraft distance information over the closely-shaped channels in the system (usually located 1 MHz apart), the RF pulse transmitter in the transponder must provide a carefully shaped reply pulse to help conserve the available spectrum. Generation of precisely-shaped RF pulses is usually accomplished by high level collector voltage modulation of RF power amplifier transistors. Such transistors are typically biased in a Class C mode of operation. This mode results in large gain variations of the amplifier over the dynamic range of the DME/P pulse, and therefore the task of stabilizing feedback-controlled modulators with which the amplifier is used is greatly complicated. Moreover, the abrupt turn-on characteristics of Class C amplifiers also necessitate use of driver pulses with "pedestals," which complicates the modulator design and adjustment process.

There is therefore a need for an improved RF pulse modulated amplifier for use in a pulse transmitter of a DME/P, which overcomes these and other problems of the prior art.

BRIEF SUMMARY OF THE INVENTION

The present invention relates to a pulse modulated amplifier having an RF power transistor as its active component, the transistor having a conduction angle which self-adjusts depending on instantaneous drive conditions. The instantaneous conduction angle is a function of RF drive power applied to the power transistor and a control current derived from a pulse modulator.

The pulse modulated amplifier preferably comprises a power transistor having a grounded base, an emitter for receiving a drive signal to be amplified, and a collector for emitting high frequency pulses. The power transistor operates over a conduction angle during which the drive signal is amplified. A pulse modulator is provided for generating a modulation drive voltage, and a current driver circuit receives the modulation drive voltage and generates a control current in response thereto. The control current is then applied to the emitter of the power transistor to control the output power of the emitted high frequency pulses.

According to the invention, for a given drive signal the conduction angle of the power transistor is proportional to the control current, and for a given control current the conduction angle of the power transistor is inversely proportional to the drive signal. Therefore, the instantaneous conduction angle of the power transistor varies throughout the generation of each high frequency pulse.

According to another feature of the invention, circuitry is provided to sense so-called "idle" current in the emitter of the power transistor between generation of the high frequency pulses. An idle current control circuit is responsive to the sensing circuitry for maintaining the power transistor in the amplifier "ON" between generation of each high frequency pulse. This circuitry allows for smooth gradual control of the power transistor, instead of requiring an RF "pedestal" to turn this transistor "ON".

BRIEF DESCRIPTION OF THE DRAWING

For a more complete understanding of the present invention and the advantages thereof, reference is now made to the following Description taken in conjunction with the accompanying Drawing in which:

The FIGURE is a schematic block diagram of a pulse amplifier according to the present invention.

DETAILED DESCRIPTION

The FIGURE is a schematic block diagram of a preferred embodiment of a pulse modulatd amplifier, designated generally by the reference numeral 10. The amplifier 10 forms part of a precision distance measuring equipment (DME/P) ground transponder used in a microwave landing system (MLS). As is known in the art, this type of transponder receives pulse pair interrogations from an interrogator located on an aircraft, and in response thereto uses the pulse modulated amplifier 10 to generate RF "reply" pulses which facilitate aircraft range determination.

The pulse modulated amplifier 10 includes appropriate circuitry for generating the RF "reply" pulses. A high frequency power transistor Q1 is provided for this purpose and is shown preferably operated in a grounded base configuration. Transistor Q1 may alternatively be operated in a grounded emitter configuration. The power transistor Q1 amplifies a high level RF drive signal provided by an RF drive signal generator 14. The RF drive signal may be either a continuous wave (CW) signal, or, as in the preferred embodiment, the output of a previously modulated amplifier stage. The RF drive signal is fed to the power transistor Q1 by way of a d.c. blocking capacitor 16 and an input impedance matching circuit 18. Input impedance matching circuit 18 includes appropriate reactive impedances to transform the resistance at the output of the RF drive signal generator 14 to the complex load impedance of the power transistor Q1.

The RF drive signal is supplied to the emitter of the power transistor Q1, which in response thereto emits high frequency pulses at its collector. These high frequency pulses are output by way of an output impedance matching network 20 and a d.c. blocking capacitor 22. The d.c. bias voltage for the power transistor Q1 is supplied by an RF decoupling network comprising high frequency choke 24 and feed-through capacitor 26 connected to an appropriate supply voltage.

ing and non-inverting inputs of a difference amplifier 54. Amplifier 54 is driven by positive and negative bias supplies, the positive supply also connected to a node 56 through a large resistor 58, preferably 15K ohms. With a positive supply voltage of 15 volts, resistor 58 therefore acts essentially as a constant current source. Connected between the sensing resistor $R_s$ and the node 56 is a resistor 60 which in the preferred embodiment has a value of approximately 220 ohms. The idle current control circuit 50 also includes resistors 62 and 64, having identical values of approximately 10K ohms, and a time constant circuit comprising a capacitor 66 and a resistor 68.

In operation of the idle current control circuit 52, the difference amplifier 54 acts substantially as a low pass filter which tries to force the voltage at nodes 56 and 70 to be the same. This operation provides a 0.22 volt drop across the sensing resistor $R_s$ to ensure that the idle current in the emitter of power transistor Q1 is approximately 1.0 milliamp for $R_s$=220 ohms. This idle current decreases the gain of power transistor Q1 to approximately −15 dB (for small signals). The output of the differencing amplifier 54 is an idle current control signal which is supplied to the transistor Q2 of the current driver circiut 30 through a resistor 72. Operation of the idle current control circuit 52 also ensures that the transistors Q2, Q3 and Q4 all remain "ON" between generation of the high frequency pulses by the pulse modulated amplifier 10.

The diode 50 is connected to ensure that substantially all the idle current flows through the sensing resistor $R_s$ between generation of the RF pulses. This is because the voltage across diode 50 between pulses is not enough to turn this diode "ON". However, during generation of the RF pulse, transistor Q4 is turned "ON" to bias diode 50 "ON," which then serves as a low impedance path for the control current supplied by the transistor Q4.

As also seen in the FIGURE, the pulse modulated amplifier 10 includes an overdrive protection circuit 76 which operates generally to prevent an emitter-base junction 78 of the power transistor Q1 from breaking-down as the RF drive signal provided by the signal generator 14 increases beyond a predetermined value. Specifically, if the RF drive power is about 10 dB higher than required to produce Class C current cutoff compression at a peak pulse power, the resulting emitter-base reverse bias voltage across the emitter-base junction 78 of power transistor Q1 causes this junction to break down. The overdrive protection circuit 76 prevents this occurrence by clamping the peak emitter-base voltage at a predetermined value, approximately 1.0 volts, even for this extreme overdrive condition.

The overdrive protection circuit primarily includes a transistor Q5 and a diode 80. In operation, as the RF drive power increases, the emitter-base reverse bias voltage across the emitter-base junction 78 of power transistor Q1 begins to rise from −0.7 volts through zero volts. Transistor Q5 of the overdrive protection circuit 74 turns "ON" at approximately zero volts across the emitter-base junction 78. The overdrive protection circuit 76 therefore acts as a low impedance source because of a one (1) ohm resistor 82 connected in the emitter circuit of the transistor Q5. As the voltage across the base-emitter junction of power transistor Q1 increases, diode 80 eventually turns "ON". At this time, the diode 80 clamps the emitter-base voltage of junction 78 at approximately 1.0 volts regardless of any subsequent increase in the RF drive signal power.

The present invention provides an improved pulse modulated amplifier for use in a pulse transmitter of precision distance measuring equipment (DME/P). The pulse modulated amplifier uses a current driver circuit to substantially control the emitter current of the power transistor Q1 throughout the entire duration of the modulated pulse. The emitter current is not predetermined, but rather is typically generated by the pulse modulator 36. The mode of operation of the RF power transistor Q1 is self-adjusting to accommodate the operating conditions, i.e., the RF drive signal and the modulation drive voltage output from the pulse modulator. Operation of the amplifier is thus Class A, Class AB or Class C, depending on the power transistor's conduction angle which typically varies between 0° and substantially 360° throughout the duration of the generated pulse.

The present invention also advantageously provides appropriate circuitry to control idle current in the power transistor between generation of each RF pulse. The idle current is constantly monitored by the idle current control circuit 52 and a feedback control connection maintains this current at a desired level in order to keep all transistors turned "ON" with trickle currents. This operation eliminates discontinuities and severe turn-on transients on the leading edges of the modulated RF pulses.

Although the pulse modulated amplifier 10 has been described in the context of a precision distance measuring equipment (DME/P) transmitter, it should be appreciated that such description is not meant to be limiting. It is envisioned that the pulse modulated amplifier 10 may be used for any pulse generation application in which a high frequency, high power pulse is generated.

Although the invention has been described in detail, it is to be clearly understood that the same is by way of example only and not by way of limitation, the scope of the present invention being limited only by the terms of the appended claims.

I claim:
1. A pulse modulated amplifier, comprising:
a power transistor for receiving a drive signal and generating high frequency pulses, the power transistor operating over a conduction angle during which the drive signal is amplified;
means for generating a modulation drive voltage;
means responsive to the modulation drive voltage and generating a control signal applied to the power transistor for controlling the conduction angle of the power transistor in a manner proportional to the control signal and inversely proportional to the drive signal, such that an instantaneous conduction angle of the power transistor self-adjusts throughout the generation of each high frequency pulse; and
means for maintaining the power transistor in a predetermined operating condition between generation of each high frequency pulse.

2. The pulse modulated amplifier as described in claim 1 wherein the power transistor has a grounded base, an emitter for receiving the drive signal and said control signal, and a collector for emitting the high frequency pulses.

3. The pulse modulated amplifier as described in claim 2 wherein the means for maintaining includes means for sensing an idle current in the emitter of the power transistor between generation of each high frequency pulse.

4. The pulse modulated amplifier as described in claim 3 wherein the means for maintaining further includes means responsive to the sensing means for clamping the power transistor "ON" between generation of each high frequency pulse.

5. The pulse modulated amplifier as described in claim 4 wherein said means responsive to the modulation drive voltage comprises:
means for receiving said modulation drive voltage and generating a signal voltage proportional thereto; and
transistor means connected to receive said signal voltage and in response thereto generating the control signal.

6. The pulse modulated amplifier as described in claim 5 wherein said means for clamping the power transistor "ON" also maintains the transistor means "ON" between generation of each high frequency pulse.

7. The pulse modulated amplifier as described in claim 1 further including means for preventing break-down of an emitter-base junction of the power transistor as the drive signal increases beyond a predetermined value.

8. A pulse modulated amplifier, comprising:
a power transistor having a grounded base, an emitter for receiving a high level drive signal to be amplified, and a collector for emitting high frequency pulses, the power transistor operating over a conduction angle during which the drive signal is amplified;
a pulse modulator for generating a modulation drive voltage;
a current driver circuit responsive to the modulation drive voltage and generating a control current applied to the emitter of the power transistor for controlling the conduction angle of the power transistor in a manner proportional to the control current and inversely proportional to the drive signal, such that an instantaneous conduction angle of the power transistor self-adjusts throughout the duration of each high frequency pulse;
a sensor for sensing an idle current in the emitter of the power transistor between generation of each high frequency pulse; and
an idle current control circuit responsive to the sensor for maintaining the power transistor "ON" between generation of each high frequency pulse.

9. The pulse modulated amplifier as described in claim 8 wherein said idle current control circuit includes:

a difference amplifier having first and second inputs, the first input for sensing the idle current from the emitter of the power transistor; and
means connected to the second input of the difference amplifier for forcing the idle current to a predetermined value between generation of each high frequency pulse.

10. The pulse modulated amplifier as described in claim 8 further including an overdrive protection circuit for clamping a voltage across an emitter-base junction of the power transistor at a predetermined value to thereby prevent break-down of this junction as the drive signal increases beyond a predetermined value.

11. An RF pulse modulated amplifier for use in precision distance measuring equipment (DME/P) of a microwave landing system (MLS), comprising:
an RF power transistor having a grounded base, an emitter for receiving a high level RF drive signal to be amplified, and a collector for emitting an RF reply pulse for use by the DME/P, the RF power transistor operating over a substantially 360° conduction angle variation during which the drive signal is amplified and modulated;
a pulse modulator for generating a modulation drive voltage having an "cos/cos$^2$" envelope;
a current driver circuit responsive to the modulation drive voltage and generating a control current applied to the emitter of the RF power transistor for controlling the conduction angle of the power transistor in a manner proportional to the control current and inversely proportional to the RF drive signal, such that an instantaneous conduction angle of the power transistor self-adjusts over substantially 360° throughout the generation of the RF reply pulse; and
means for maintaining the power transistor in a predetermined operating condition between generation of each RF reply pulse.

12. The RF pulse modulated amplifier as described in claim 11 wherein the means for maintaining includes means for sensing an idle current in the emitter of the RF power transistor following generation of the RF reply pulse.

13. The RF pulse modulated amplifier as described in claim 12 wherein the means for maintaining further includes an idle current control circuit responsive to the sensing means for clamping the RF power transistor "ON" following generation of the RF reply pulse.

14. The RF pulse modulated amplifier as described in claim 11 further including an overdrive protection circuit for preventing break-down of an emitter-base junction of the RF power transistor as the RF drive signal increases beyond a predetermined value.

* * * * *